US008443836B2

(12) United States Patent
Liu

(10) Patent No.: US 8,443,836 B2
(45) Date of Patent: May 21, 2013

(54) VENTILATING APPARATUS

(75) Inventor: Chih-I Liu, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 413 days.

(21) Appl. No.: 12/842,253

(22) Filed: Jul. 23, 2010

(65) Prior Publication Data

US 2011/0277858 A1  Nov. 17, 2011

(30) Foreign Application Priority Data

May 12, 2010 (TW) .............................. 99115057 A

(51) Int. Cl.
F16K 11/20 (2006.01)
B23K 31/00 (2006.01)
B23K 31/02 (2006.01)

(52) U.S. Cl.
USPC ........ 137/597; 137/561 A; 137/375; 137/583; 228/4.5; 228/180.5

(58) Field of Classification Search
USPC .................. 137/597, 561 A, 561 R, 338, 375, 137/583; 228/180.5, 904, 4.5, 218–220, 42
See application file for complete search history.

(56) References Cited

U.S. PATENT DOCUMENTS

| 165,944 | A | * | 7/1875 | Newman et al. .............. 137/375 |
| 2,078,606 | A | * | 4/1937 | Le Grand ...................... 137/375 |
| 4,575,602 | A | | 3/1986 | Sakurai |
| 4,598,859 | A | * | 7/1986 | Cajthaml et al. .............. 228/185 |
| 5,400,830 | A | * | 3/1995 | Stiles et al. .................... 138/149 |
| 6,234,376 | B1 | | 5/2001 | Wicen |
| 6,267,290 | B1 | | 7/2001 | Murdeshwar |
| 2008/0000950 | A1 | * | 1/2008 | Nishiura et al. ........... 228/180.5 |
| 2008/0099531 | A1 | * | 5/2008 | Wong et al. .................... 228/4.5 |
| 2009/0095354 | A1 | * | 4/2009 | Taskar ....................... 137/15.01 |

* cited by examiner

Primary Examiner — Stephen M Hepperle
Assistant Examiner — Seth Faulb
(74) Attorney, Agent, or Firm — Ming Chow; Sinorica, LLC

(57) ABSTRACT

This invention discloses a ventilating apparatus which has a configuration extending along a first axis, a second axis and a third axis. The first axis, the second axis and the third axis are orthogonal to each other. The ventilating apparatus includes a main body, a tail pipe and an airtight sealing material. The main body made of porous ceramics having an outer surface. The main body has a head end and a tail end disposed along the second axis, a first aperture passing therethrough along the first axis near the head end of the main body, and a first air orifice extending along the second axis. The tail pipe has a second aperture which is connected to the first aperture of the main body. The airtight sealing material covering the outer surface of the main body with the first aperture exposed.

6 Claims, 4 Drawing Sheets

VENTILATING APPARATUS

BACKGROUND OF THE INVENTION

1. Technical Field

The present invention relates to ventilating apparatuses, and more particularly to a ventilating apparatus applied to a wire bonder for semiconductor devices in order to ensure circulation of protective gas.

2. Description of Related Art

In the known packaging technology for semiconductor devices, wire bonding is used to achieve transmission of signals on dies to carriers (e.g. leadframes, substrates, etc.), and external terminals (e.g. Solder balls or lead fingers of leadframes, etc.) then serve for connection to PCBs. Formation of such a wire bond mainly involves using a capillary to deliver a metal wire, such as a copper wire, a silver wire, a gold wire or the like, and forming a FAB (Free Air Ball) at the distal of the wire while implementing a gas supplying device to continuously provide protective gas so as to secure good formation of the FAB. The foregoing protective gas is preferably nitrogen gas, argon gas or nitrogen and hydrogen mixed gas. Therein, nitrogen gas and argon gas are capable of protecting the FAB from oxidization, and hydrogen in nitrogen and hydrogen mixed gas can further restore the oxidized part of the FAB, thereby facilitating good formation of the FAB. At last, the FAB connected with the wire bond is attached to the die or a pad on the carrier. Thus, effective control of the wire bonding process can be achieved, and in turn the high yield of semiconductor packaging can be ensured. As to the wire bonding process, some prior arts such as U.S. Pat. No. 6,234,376 and U.S. Pat. No. 4,575,602 have proposed the approach of employing a ventilating apparatus to deliver protective gas to the melted copper wire or gold wire so as to facilitate sintering the spherical FAB. However, both of the prior arts are limited to unidirectional provision of protective gas and disadvantageously lead to unstable or turbulent flow of protective gas in the ventilating apparatus, which in turn causes abnormal FAB sintering, such as breakage, bias, damage, chipping and so on, each leading to failed die after the wire bonding process.

On the other hand, there are prior arts focused on maintaining protective gas around the formed FAB until the wire bonding process so as to protect the FAB from oxidization and in turn from abnormalities. Therein, an additional gas pipe is required to supply the protective gas such as nitrogen gas, argon gas or nitrogen and hydrogen mixed gas to the formed FAB. However, the additional gas pipe needs to be mechanically controlled and this certainly means increased costs for equipment and inconvenience in operation.

SUMMARY OF THE INVENTION

In an attempt to overcome the defects of the prior arts, the present invention provides a ventilating apparatus having a configuration extending along a first axis, a second axis and a third axis, wherein the first axis, the second axis and the third axis are orthogonal to each other. The ventilating apparatus comprises a main body, a tail pipe and an airtight sealing material. The main body made of porous ceramics having an outer surface, a head end and a tail end disposed along the second axis, a first aperture passing therethrough along the first axis near the head end of the main body, and a first air orifice extending along the second axis, wherein the first air orifice passes through from the tail end of the main body to the first aperture. The tail pipe being connected to the tail end of the main body and having a second aperture passing therethrough along the second axis, wherein the second aperture is connected to the first air orifice. The airtight sealing material covering the outer surface of the main body with the first aperture exposed.

Thus, a primary objective of the present invention is to provide a ventilating apparatus, which has a main body novelly made of porous ceramics so that the main body is enabled to evenly guide protective gas and prevent turbulent flow of protective gas in the first aperture of the ventilating apparatus, thereby forming a relatively stable layer of protective gas around the FAB during its formation and causing the sintered FAB to have improved shape evenness.

The present invention further provides another ventilating apparatus having a configuration extending along a first axis, a second axis and a third axis, wherein the first axis, the second axis and the third axis are orthogonal to each other. The ventilating apparatus comprises a main body, a tail pipe, an airtight sealing material and an outer pipe. The main body made of porous ceramics having an outer surface, the main body further having a head end and a tail end disposed along the second axis, a first aperture passing therethrough along the first axis near the head end of the main body, and a first air orifice extending along the second axis, wherein the first air orifice passes through from the tail end of the main body to the first aperture. The tail pipe being connected to the tail end of the main body and having a second aperture passing therethrough along the second axis, wherein the second aperture is connected to the first air orifice. The airtight sealing material covering the outer surface of the main body with the first aperture exposed. The outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

Another objective of the present invention is to provide a ventilating apparatus, which has a main body novelly made of porous ceramics so that the main body is enabled to evenly guide protective gas and prevent turbulent flow of protective gas in the first aperture of the ventilating apparatus, thereby forming a relatively stable layer of protective gas around the FAB during its formation and causing the sintered FAB to have improved shape evenness.

Still another objective of the present invention is to provide a ventilating apparatus, which uses an outer pipe to dispense with additional gas pipes for protective gas such as nitrogen gas, argon gas or nitrogen and hydrogen mixed gas that would be required in the prior art, so as to reduce costs for equipment and improve operational convenience.

BRIEF DESCRIPTION OF THE DRAWINGS

The invention as well as a preferred mode of use, further objectives and advantages thereof will be best understood by reference to the following detailed description of illustrative embodiments when acquire in conjunction with the accompanying drawings, wherein.

DETAILED DESCRIPTION OF THE INVENTION

While the present invention discloses embodiments of a ventilating apparatus to be applied to a wire bonder for semiconductor devices, the manufacturing principles and basic features of wire bonding have been known to people of ordinary skill in the art, and thus will not be described in any length herein. Meantime, the accompany drawings to be read in conjunction with this description are intended to graphically illustrate the featured structure of the present invention and need not to be made to scale.

Figure 1A:
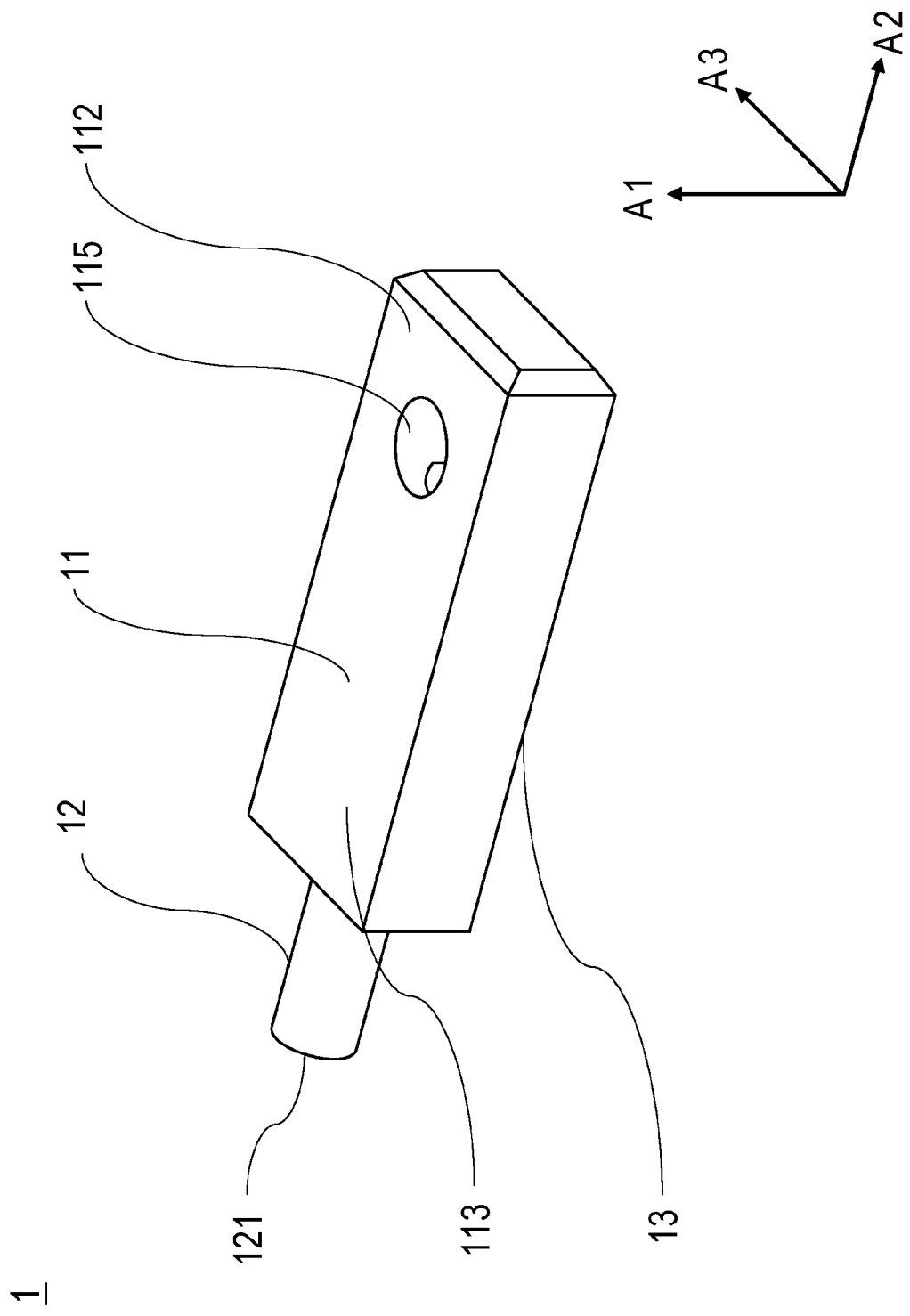
FIG. 1A is a perspective schematic view of a ventilating apparatus according to a first preferred embodiment of the present invention.

First referring to FIG. 1A, a ventilating apparatus 1 according to a first preferred embodiment of the present invention has a configuration extending along a first axis A1, a second axis A2 and a third axis A3, wherein the first axis A1, the second axis A2 and the third axis A3 are orthogonal to each other. The ventilating apparatus 1 mainly comprises a main body 11, a tail pipe 12 and an airtight sealing material 13, wherein the main body 11 is made of porous ceramics, and the material of the airtight sealing material 13 is heat insulation material.

Figure 1B:
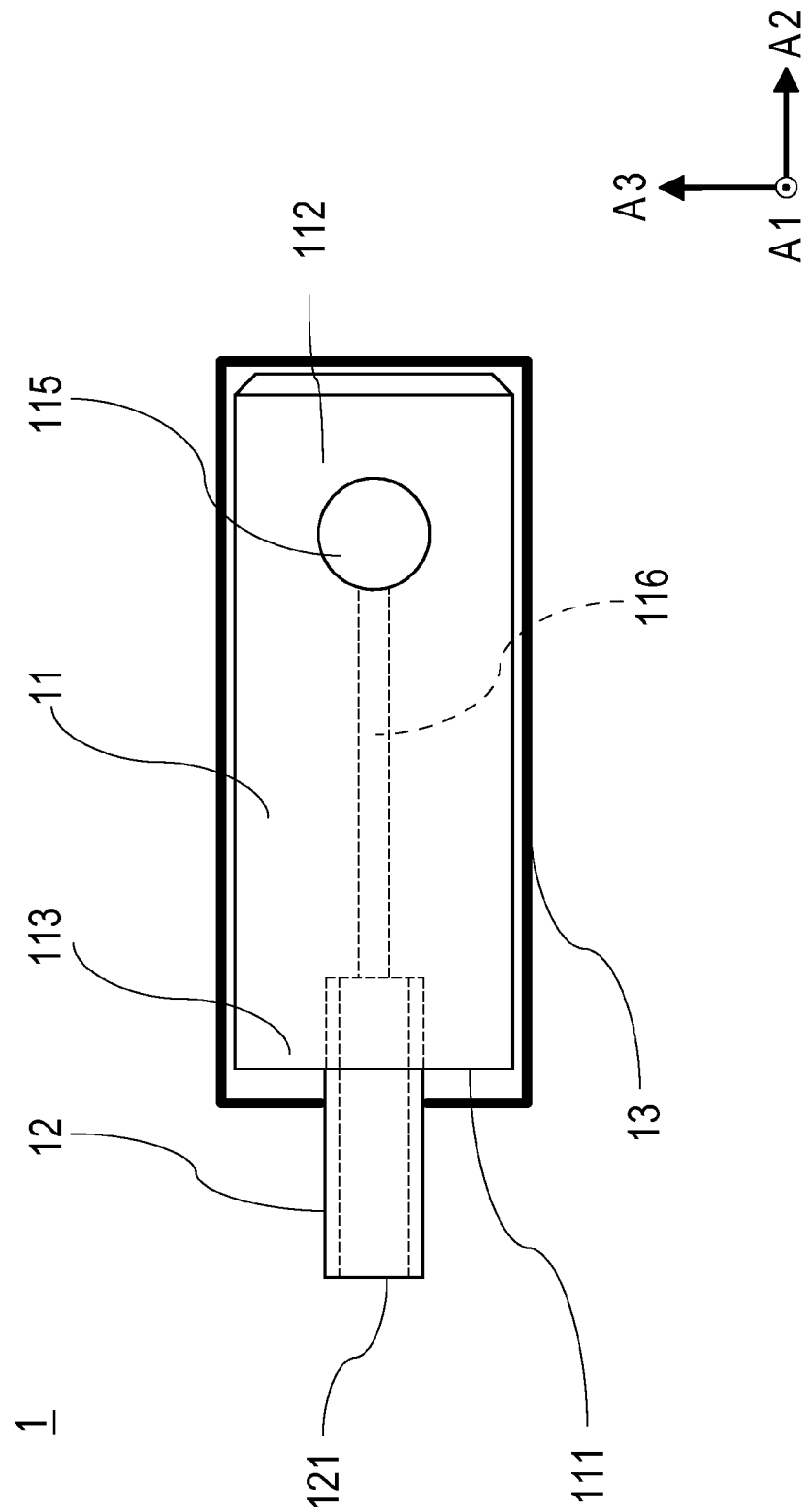
FIG. 1B is a top schematic view of the ventilating apparatus according to the first preferred embodiment of the present invention.

Referring to FIG. 1B, the main body 11 comprises an outer surface 111, a head end 112 and a tail end 113. A first aperture 115 passing through the main body 11 along the first axis A1 near the head end 112 is configured to allow a capillary (not shown), which is installed therein a vertically transported metal wire to pass therethrough, so that when lowered in the main body 11 to a discharging altitude, the metal wire contacting a discharging device (not shown) is heated and melted, so as to be sintered and form a FAB distally.

Still referring to FIG. 1B, the main body 11 further comprises a first air orifice 116 that extends along the second axis A2 and passes through the tail end 113 to the first aperture 115 of the main body 11. In addition, the tail pipe 12 is connected to the tail end 113 of the main body 11. A second aperture 121 passing through the tail pipe 12 along the second axis A2 is connected to the first air orifice 116. The first air orifice 116 has a diameter smaller than or equal to that of the second aperture 121, in which the first air orifice 116 is preferable to has a diameter smaller than that of the second aperture 121. It is to be noted that since the main body 11 is made of porous ceramics, for preventing protective gas in the first air orifice 116 from unintentionally flowing out of the main body 11, the airtight sealing material 13 covers the outer surface 111 of the main body with first aperture 115 exposed, so as to restrict the protective gas in the first air orifice 116 to the first aperture 115. Meantime, because the main body 11 is made of porous ceramics, the protective gas introduced from the second aperture 121 of the tail pipe 12 to the first air orifice 116 in virtue of the porous structure of the ceramics can permeate into the first aperture 115 from its periphery in all directions to form a protective gas barrier.

The foregoing structure matters physically. While the metal wire rapidly goes in and out the first aperture 115 of the main body 11 to be melted and sintered into the FAB, the different moving directions of the metal wire for entering and exiting the first aperture 115 cause variation of the pressure of the protective gas, and in turn lead to inconsistent fluid speed that is a reason of turbulent gas flow in the first aperture 115. With unreliable coverage of the turbulent flow of the protective gas, the metal wire when getting melted and sintered into the FAB tends to form uneven spherical shape and become a defective product. By the main body 11 made of porous ceramics as disclosed in the present invention, the protective gas permeates into the first aperture 115 from its periphery in all directions to form a protective gas barrier, and the turbulent gas flow in the first aperture 115 can be prevented so that a relatively stable layer of protective gas can be formed around the FAB during its formation, causing the sintered FAB to have improved shape evenness.

Figure 2:
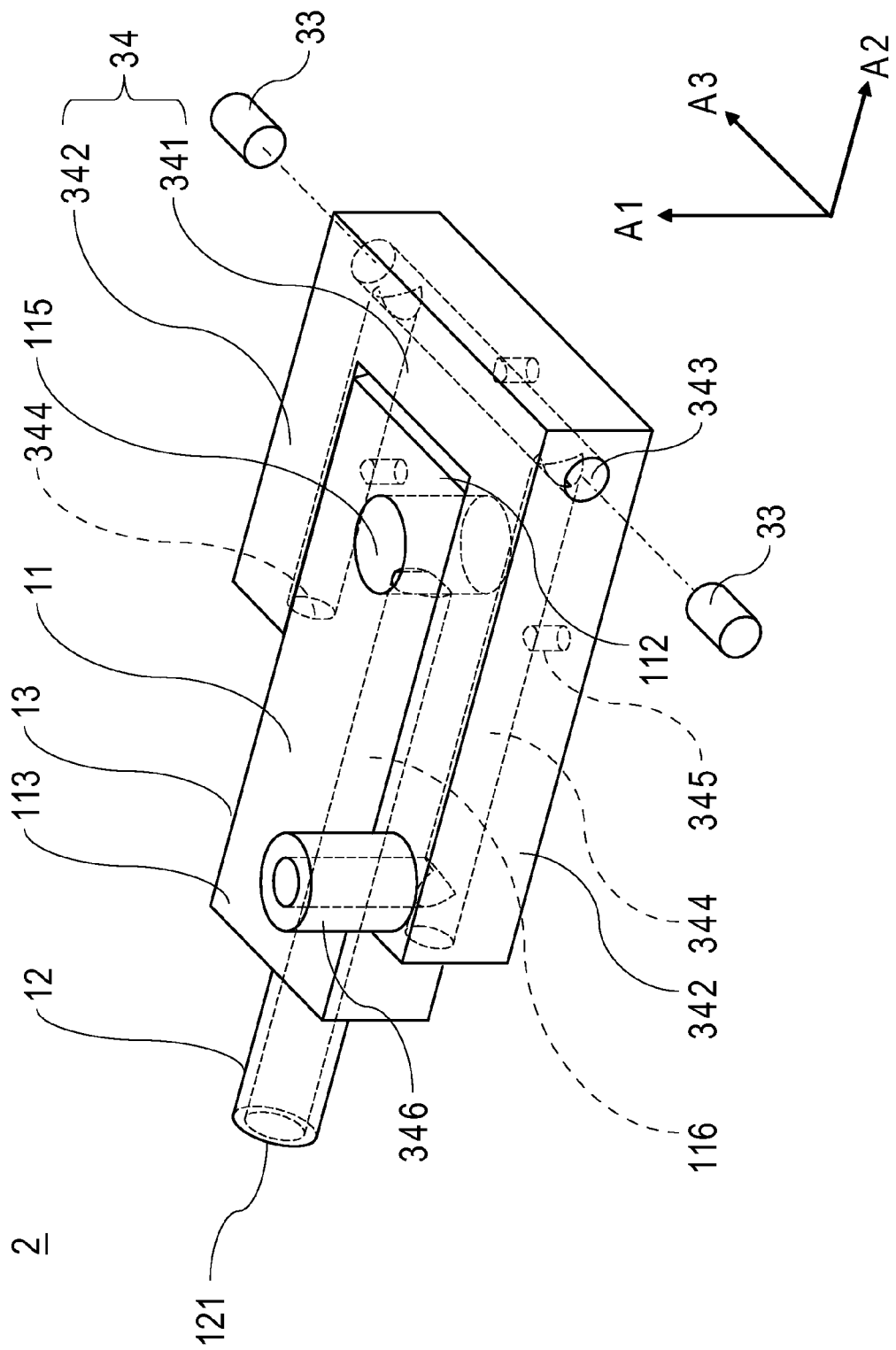
FIG. 2 is a perspective schematic view of a ventilating apparatus according to a second preferred embodiment of the present invention.

Referring to FIG. 2, in a second preferred embodiment of the present invention, a ventilating apparatus 2 has a configuration extending along a first axis A1, a second axis A2 and a third axis A3, wherein the first axis A1, the second axis A2 and the third axis A3 are orthogonal to each other. The ventilating apparatus 2 mainly comprises a main body 11, a tail pipe 12, an airtight sealing material 33 and an outer pipe 34, wherein the main body 11 is made of porous ceramics, for preventing protective gas in the first air orifice 116 from unintentionally flowing out of the main body 11, the airtight sealing material 13 covers the outer surface 111 of the main body with first aperture 115 exposed. Therein, the main body 11 and the tail pipe 12 have features and effects substantially equal to those of the main body 11 and the tail pipe 12 of the first preferred embodiment, as shown in FIG. 1A and FIG. 1B, and will not be repeatedly described herein.

In the present embodiment, the ventilating apparatus 2 further has the outer pipe 34, which is connected to a gas pipe (not shown) supplying protective gas such as nitrogen gas, argon gas or nitrogen and hydrogen mixed gas. Therein, the outer pipe 34 includes a bottom segment 341 and two side segments 342 connected to two ends of the bottom segment 341, thus forming a U-shaped pipe that fittingly receives the main body 11 in the U-shaped area enclosed by the U-shaped pipe so that the outer pipe 34 circles the main body 11 and the main body 11 has the head end 312 facing the bottom segment 341. The U-shaped outer pipe 34 is configured to guide the protective gas (e.g. nitrogen gas, argon gas or nitrogen and hydrogen mixed gas) to the formed FAB, so as to protect the FAB from being deformed by external air that invades the protective gas because of the vertical movement of the capillary that brings the external air into the first aperture 115. Thereby, the present invention can dispense with the mechanically controlled gas supplying devices such as nitrogen gas pipes, argon gas pipes and the like, so as to reduce costs and improve operational convenience.

It is to be noted that the outer pipe 34 further comprises bypassing channels and a plurality of air vents 345. The bypassing channels are configured inside the bottom segment 341 and the side segments 342, and further include a fifth air orifice 343 along the third axis A3 and a pair of sixth air orifices 344 along the second axis A2. Therein, the fifth air orifice 343 has two ends closed while each said sixth air orifice 344 has one end closed and both of the sixth air orifices 344 are connected to the fifth air orifice 343. Therefore, each of the plural air vents 345 has one end connected to the bypassing channels and an opposite end connected to the exterior of the outer pipe 34. Furthermore, the configuration of the outer pipe 34 is not limited to the disclosure of the present invention and may be reversed according to practical needs.

Figure 3:
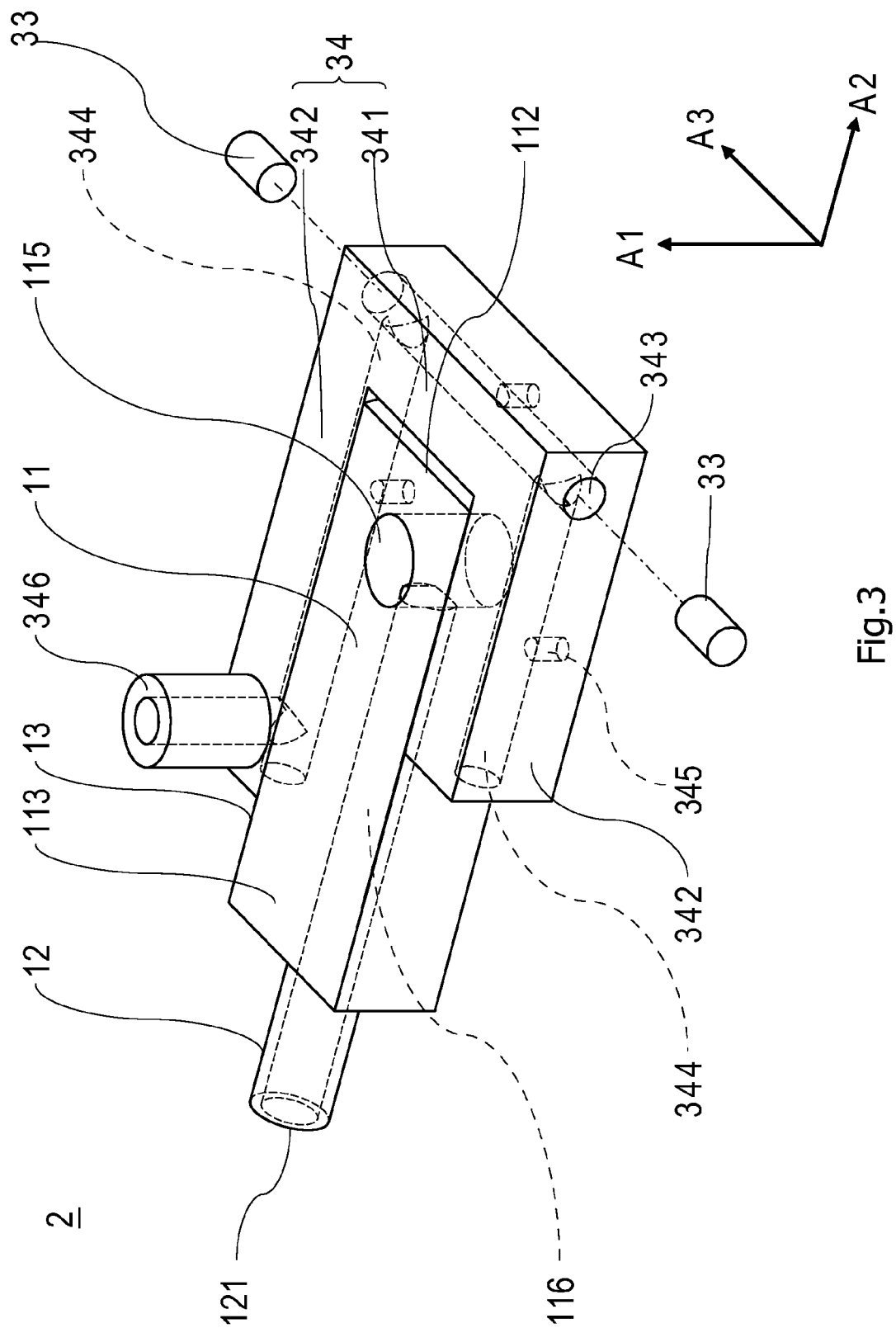
FIG. 3 is a perspective schematic view of a ventilating apparatus according to a second preferred embodiment of the present invention.

Keeping looking at FIG. 2, an air inlet 346 attached to the outer pipe 34 has one end connected to a supply of nitrogen gas, argon gas or nitrogen and hydrogen mixed gas, and an opposite end connected to the sixth air orifice 344. Wherein the air inlet 346 is connected to the bypassing channels of the outer pipe 34. The air inlet 346 also includes therein a channel that is connected to the bypassing channels inside the side segments 342 so that the nitrogen gas, argon gas or nitrogen and hydrogen mixed gas entering from the air inlet 346 can flow along the bypassing channels and discharged from the air vents 345 to form the protective gas of nitrogen gas, argon gas or nitrogen and hydrogen mixed gas. Referring to FIG. 2 and FIG. 3, the configuration of the air inlet 346 is not limited to the disclosure of the present invention and may be arranged upward or downward, or abreast with the tail pipe 12, according to practical needs.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A ventilating apparatus having a configuration extending along a first axis, a second axis and a third axis, wherein the first axis, the second axis and the third axis are orthogonal to each other, the ventilating apparatus comprising:
   a main body made of porous ceramics having an outer surface, the main body further having a head end and a tail end disposed along the second axis, a first aperture passing therethrough along the first axis near the head end of the main body, and a first air orifice extending along the second axis, wherein the first air orifice passes through from the tail end of the main body to the first aperture;
   a tail pipe being connected to the tail end of the main body and having a second aperture passing therethrough along the second axis, wherein the second aperture is connected to the first air orifice;
   an airtight sealing material covering the outer surface of the main body with the first aperture exposed; and
   an outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

2. The ventilating apparatus of claim 1, wherein the bypassing channels further includes a fifth air orifice and a pair of sixth air orifices, the fifth air orifice being configured at the bottom segment along the third axis with two ends thereof closed, each said sixth air orifice being configured at a respective said side segment along the second axis, and each said sixth air orifice being connected to the fifth air orifice.

3. The ventilating apparatus of claim 1, wherein the first air orifice has a diameter smaller than the second aperture.

4. The ventilating apparatus of claim 1, wherein the first air orifice has a diameter equal to the second aperture.

5. The ventilating apparatus of claim 1, wherein the material of the airtight sealing material is heat insulation material.

6. The ventilating apparatus of claim 1, further comprising an air inlet, wherein the air inlet is connected to the bypassing channels of the outer pipe.

* * * * *